United States Patent [19]
Hushimi et al.

[11] Patent Number: 5,576,658
[45] Date of Patent: Nov. 19, 1996

[54] PULSE SHAPING CIRCUIT

[75] Inventors: Kazuo Hushimi; Masahiko Kuwata, both of Tokyo, Japan

[73] Assignees: JEOL Ltd.; JEOL Engineering Co. Ltd., both of Tokyo, Japan

[21] Appl. No.: 466,825

[22] Filed: Jun. 6, 1995

[30] Foreign Application Priority Data

Jun. 6, 1994 [JP] Japan ................... 6-123516

[51] Int. Cl.$^6$ ................................... H03K 5/00
[52] U.S. Cl. ................ 327/552; 327/551; 327/100; 327/165; 327/167; 327/334; 327/335; 327/336; 327/307; 330/306; 330/11
[58] Field of Search ..................... 327/551, 552, 327/553, 554, 555, 556, 557, 558, 335, 336, 344, 307, 165, 167, 100, 334; 330/107, 109, 303, 304, 306, 11

[56] References Cited

U.S. PATENT DOCUMENTS

| | | | |
|---|---|---|---|
| 4,211,981 | 7/1980 | Lerma | 327/344 |
| 4,481,466 | 11/1984 | Roos et al. | 327/302 |
| 4,968,898 | 11/1990 | Hushimi et al. | 327/552 |

FOREIGN PATENT DOCUMENTS

| | | | |
|---|---|---|---|
| 4134951 | 10/1979 | Japan | 322/552 |

OTHER PUBLICATIONS

Husimi et al., "Trapezoidal Filtering of Signals Realized by the Directly Synthesized Gaussian Filter", *IEEE Transactions on Nuclear Science*, vol. 36, No. 1, Feb. 1989, pp. 396–399.

*Primary Examiner*—Timothy P. Callahan
*Assistant Examiner*—Dinh T. Le
*Attorney, Agent, or Firm*—Webb Ziesenheim Bruening Logsdon Orkin & Hanson, P.C.

[57] ABSTRACT

There is disclosed a rectangular filter which has a simple configuration and is capable of producing an improved rectangular wave. An input step wave is differentiated by a differentiator circuit and amplified by a first amplifier. The output from the amplifier is inverted by an inverting amplifier having a gain of $-1$. The output from the first amplifier is integrated by an integrator circuit having a time constant equal to the time constant of the differentiator circuit. The output from the inverting amplifier and the output from the integrator circuit are summed up by an adding circuit. The input signal is faithfully reproduced at the output of the adding circuit. After a given time passes since the input signal has been applied, the capacitor of the integrator circuit is shorted out. In this way, a rectangular wave is obtained. There is also disclosed a filter amplifier comprising this rectangular filter and a gated integrator for integrating the output from the rectangular filter for a predetermined time.

8 Claims, 3 Drawing Sheets

PULSE SHAPING CIRCUIT

BACKGROUND OF THE INVENTION

1. Field of the Invention

The present invention relates to a filter amplifier (an active filter) incorporated in a pulse processor used in an electron probe microanalyzer or the like. The invention also relates to an active filter having a rectangular output.

2. Description of the Prior Art

Pulse processors used to detect radiations such as X-rays and gamma rays radiated from specimens are designed to process output signals from detectors in a given manner. The configuration of one example of these pulse processors is schematically shown in FIG. 5, where a detector 4 produces a step wave which is applied to a filter amplifier (also known as an active filter) 2 included in the pulse processor, indicated by 1. The detector 4 can take any form.

Ideally, the step wave produced from the detector 4 should have the form shown at A in FIG. 6. In practice, the step wave assumes the form shown at B in FIG. 6 because of leakage occurring in the detector 4 and for other causes. Furthermore, noises are actually superimposed on the wave shown at B of FIG. 6. These noises include three kinds of noises, i.e., thermal noise, current noise and flicker noise. Normally, the time constant of the filter amplifier 2 is set to a small value mainly to have a short measuring time. In practice, it is known that the thermal noise predominates. The thermal noise is also known as delta noise. The current noise is also termed step noise.

In this way, the step wave shown at B of FIG. 6 on which noises are superimposed is applied to the filter amplifier 2. The height H of this step wave corresponds to the detected radiation and so it is necessary to precisely know the height H of the step wave.

Normally, the height of the signal applied to the filter amplifier 2 is detected and processing is performed so that the detected height is converted into a given waveform. The output signal from the filter amplifier 2 is applied to an analog-to-digital converter 3, where the height H detected by the filter amplifier 2 is converted into a digital form. This output signal from the converter 3 is sent to a processor (not shown) located in the following stage.

Usually, the actual pulse processor is equipped with various means such as a pileup rejector and a live time-correcting circuit. If plural signals are superimposed on the input signal to the pulse processor, the pileup rejector nullifies these superimposed signals. The live time-correcting circuit detects the live time. Since these means are not essential for the present invention, they will not be described below.

Generally, a Gaussian filter or a triangular filter is used as the filter amplifier 2. The noise characteristics and the counting rate characteristics vary, depending on the used filter amplifier. For example, it is known that if the set time constant of the filter is increased, the noise characteristics, i.e., the resolution, are improved but the counting rate characteristics are deteriorated. Conversely, if the set time constant is reduced, then the resolution is deteriorated but the counting rate characteristics are enhanced.

Accordingly, there is a demand for a filter amplifier which has a time constant providing the desired resolution and which, therefore, provides a maximum counting rate achievable. In order to evaluate the filter amplifier having these two conflicting factors, i.e., resolution and counting rate characteristics, some index is needed.

Goulding of California University has proposed a novel method of evaluating the filter amplifier. In particular, the product of the dead time and squares of delta noise is used as a figure of merit. He says that the figure of merit of the Gaussian filter is 9.4 and that the figure of merit of the triangular filter (also known as an active filter with a triangular output) proposed by Goulding himself is 6. It can be seen from the definition that as the Goulding's figure of merit is reduced, more desirable results are produced.

In comparing the Gaussian filter with the triangular filter, the triangular filter is preferable to the Gaussian filter as long as the figure of merit proposed by Goulding is used. We have proposed a filter amplifier having a better figure of merit (*IEEE Trans. Nucl. Sci.*, Vol. 36, No. 1, February 1989, pp. 396–399).

This filter amplifier employs a rectangular filter and a gated integrator. Assuming that the rectangular filter is ideal, the calculated figure of merit of this filter amplifier is 4. This is the best one of the theoretical values of various filters proposed heretofore.

When the step wave as shown at B of FIG. 6 is applied to the rectangular filter (also known as an active filter with a rectangular output), it converts the step wave into the rectangular wave shown at C of FIG. 6. However, an ideal rectangular filter cannot be accomplished. Therefore, the conventional rectangular filter is approximated by plural stages of Gaussian filters, but it has been very difficult to manage the production of rectangular filters of this construction, for the following reason.

FIG. 7 shows the structure of the prior art rectangular filter. A step wave from a detector (not shown) is first differentiated by a differentiator circuit 5. Three Gaussian filters 6, 7 and 8 are connected in series and located after the differentiator circuit 5. These filters 6, 7 and 8, have mutually different time constants. For example, these filters 6, 7 and 8 have successively longer time constants in this order. The output from the differentiator circuit 5, the output from the Gaussian filter 6, the output from the Gaussian filter 7 and the output from the Gaussian filter 8 are summed up by an adding circuit 9.

The step wave delivered from the detector can be converted into an approximate rectangular wave by the structure described above. If a gated integrator is connected after the rectangular filter to constitute a filter amplifier, it is confirmed that the figure of merit of this filter amplifier is 5.07. This is described in the above-cited paper.

However, the rectangular filter shown in FIG. 7 is required to have plural stages of Gaussian filters. Therefore, the circuit configuration is rendered very complex. In addition, every circuit element, such as resistors and capacitors forming the Gaussian filters, must have very high accuracy. Therefore, it is very difficult to manage the production. In practice, it has been confirmed that where resistors and capacitors forming the Gaussian filters have poor accuracies, waveforms are distorted.

As can be seen from the foregoing, where the rectangular filter shown in FIG. 7 is used, an improved figure of merit can be obtained. However, the rectangular wave obtained by summing up the outputs from plural Gaussian filters of different time constants and the output from the differentiator circuit is merely an approximate wave. Hence, the rectangular filter is not sufficiently satisfactory.

SUMMARY OF THE INVENTION

The present invention has been made to solve the foregoing problems.

It is an object of the present invention to provide a rectangular filter which can produce better rectangular waves than heretofore, is simple in structure, can be made up of a much reduced number of circuit elements and which can be fabricated with easier production control.

It is another object of the invention to provide a filter amplifier having desired resolution characteristics and improved counting rate characteristics.

A first embodiment of the invention resides in a rectangular filter comprising: a differentiator circuit for differentiating an input signal, said differentiator circuit having a time constant; an integrator circuit having a time constant equal to the time constant of said differentiator circuit, said integrator circuit acting to integrate an output signal from said differentiator circuit; and an adding circuit for adding up the output signal from said differentiator circuit and an output signal from said integrator circuit.

A second embodiment of the invention is based on the first embodiment and characterized in that said differentiator circuit is equipped with switches for switching the time constant of said differentiator circuit between different values.

A third embodiment of the invention is based on the first or second embodiment described above and characterized in that said integrator circuit is equipped with a switch for releasing electric charge stored in an integrating capacitor.

A fourth embodiment of the invention is based on the first, second or third embodiment described above and characterized in that a baseline reproduction circuit for removing an offset component from the input signal is connected in parallel with said integrator circuit or placed before said integrator circuit.

A fifth embodiment of the invention resides in a filter amplifier comprising a rectangular filter and a gated integrator for integrating an output signal from said rectangular filter for a predetermined time. The rectangular filter comprises: a differentiator circuit for differentiating an input signal, said differentiator circuit having a time constant; an integrator circuit having a time constant equal to the time constant of said differentiator circuit, said integrator circuit acting to integrate an output signal from said differentiator circuit; and an adding circuit for adding up the output signal from said differentiator circuit and an output signal from said integrator circuit.

In the novel rectangular filter, the input signal is first differentiated by the differentiator circuit. The signal is then integrated by the integrator circuit. The time constant of this integrator circuit is set equal to that of the differentiator circuit. The output signal from the differentiator circuit and the output signal from the integrator circuit are summed up by the adding circuit. Thus, the input step wave can be faithfully reproduced. Since the novel rectangular filter is much simpler in structure than the prior art rectangular filter, the cost can be greatly reduced.

The components of the differentiator circuit and of the integrator circuit in the rectangular filter are required to have relatively high accuracies in order to set the time constants of the differentiator circuit and of the integrator circuit to desired values and to set both time constants equal to each other. However, these accuracies are lower than the accuracies that the components of the prior art Gaussian filter must achieve. Therefore, production of the rectangular filter is much easier to manage than heretofore.

The differentiator circuit can be equipped with a switch for switching the time constant as in the second embodiment.

In this structure, electric charge stored in the differentiator circuit can be released by closing the switch. Consequently, the output signal from the differentiator circuit can be rapidly brought close to zero level. Hence, the output from the differentiator circuit can be made to assume a rectangular waveform. The width of the obtained rectangular wave can be narrowed by shortening the time between the instant when the input signal arrives and the instant when this switch is closed. Therefore, the dead time can be shortened. As a result, the counting rate characteristics can be improved.

The integrator circuit can be equipped with a switch for releasing electric charge stored in the integrating capacitor as in the third embodiment. In this structure, the rising portion of the output from the integrator circuit can be made steeper. This makes it possible to generate a more complete rectangular wave. Moreover, the width of the finally obtained rectangular wave can be shortened by shortening the time which starts when the integration action is started and ends when electric charge is released by closing the switch. In consequence, the counting rate characteristics can be enhanced.

A baseline reproduction circuit can be inserted in parallel with or before the integrator circuit as in the fourth embodiment. In this structure, if the amplifier stage contains an offset component, it can be removed by the baseline reproduction circuit. The height of the input signal can be precisely detected.

In the novel rectangular filter described thus far, the time constant of the differentiator circuit and the time constant of the integrator circuit are set to appropriate values. In this manner, the required noise characteristics, i.e., the required resolution, can be obtained. Moreover, the counting rate characteristics can be made higher than heretofore.

A filter amplifier according to the present invention comprises a rectangular filter and a gated integrator. The rectangular filter has a differentiator circuit for differentiating an input signal, said differentiator circuit having a time constant, an integrator circuit having a time constant equal to the time constant of said differentiator circuit, said integrator circuit acting to integrate an output signal from said differentiator circuit, and an adding circuit for adding up the output signal from said differentiator circuit and an output signal from said integrator circuit. The output signal from the rectangular filter is integrated for a predetermined time by the gated integrator.

This structure permits fabrication of an ideal filter amplifier as described in the above-cited paper. Consequently, the resolution and the counting rate characteristics can be improved greatly compared with the prior art filter amplifier.

Other objects and features of the invention will appear in the course of the description thereof, which follows.

DETAILED DESCRIPTION OF THE PREFERRED EMBODIMENTS

Figure 1:
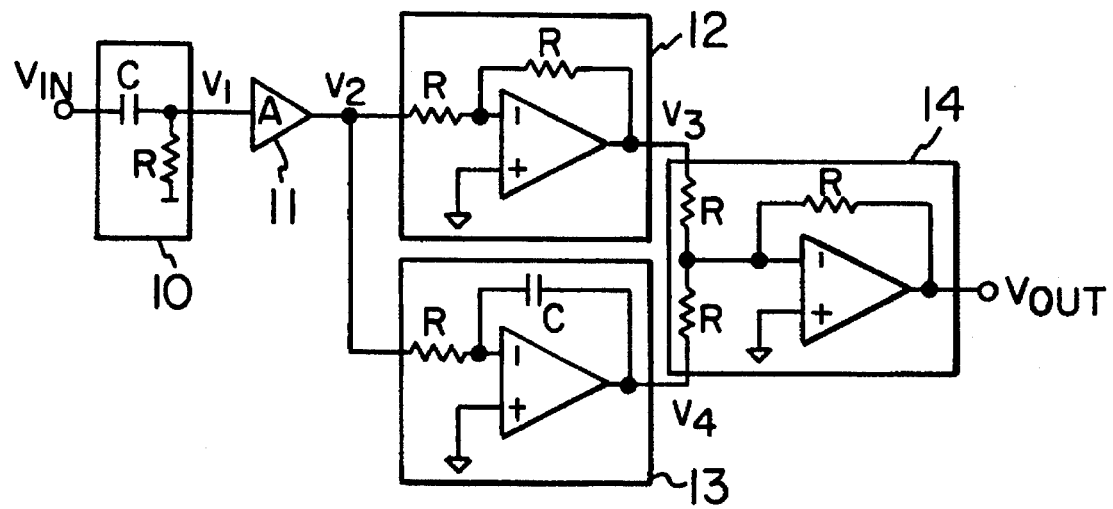
FIG. 1 is a circuit diagram of a rectangular filter according to the present invention.
Figure 2:
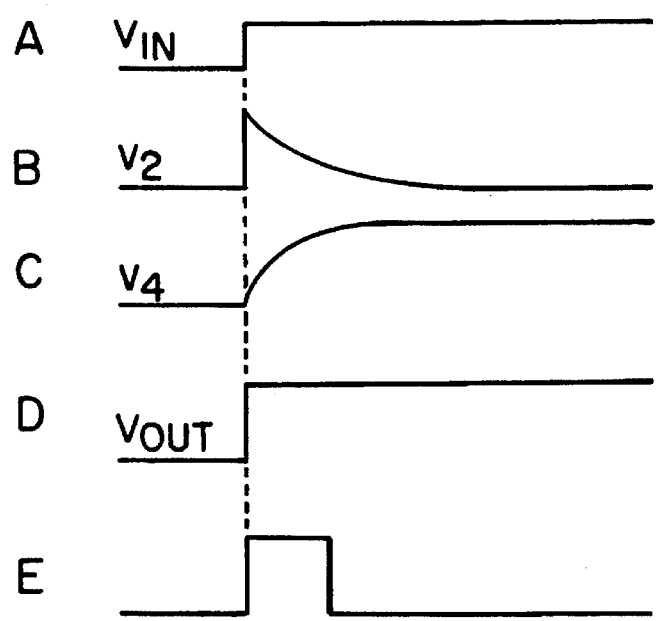
FIG. 2 is a waveform diagram illustrating waveforms appearing at various locations in the filter shown in FIG. 1.

FIG. 1 shows the configuration of a rectangular filter according to the present invention. FIG. 2 shows waveforms appearing at various locations in the configuration shown in FIG. 1.

In FIG. 1, it is assumed that a step wave signal $V_{IN}$ shown at A of FIG. 2 is applied. This input signal $V_{IN}$ is differentiated by a differentiator circuit 10. The output $v_1$ from the differentiator circuit 10 is given by Eq. (1). Of course, the time constant of the differentiator circuit 10 is determined by the values of C and R.

$$v_1 = \frac{j\omega CR}{1+j\omega CR} V_{IN} \quad (1)$$

The output signal from the differentiator circuit 10 is amplified by an amplifier 11. The waveform of the output signal from the amplifier 11 is shown at B of FIG. 2. Let A be the gain of the amplifier 11. The output signal from the amplifier 11 is given by Eq. (2).

$$v_2 = A \cdot \frac{j\omega CR}{1+j\omega CR} \cdot V_{IN} \quad (2)$$

The output from the amplifier 11 is applied to the amplifier 12 having a gain of −1 and also to an integrator circuit 13. Therefore, the output from the amplifier 12 is $v_3 = -v_2$.

As can be seen from the configuration shown in FIG. 1, the time constant of the integrator circuit 13 is set equal to the time constant of the differentiator circuit 10. Therefore, the output $v_4$ from the integrator circuit 13 assumes the form shown at C of FIG. 2 and is given by Eq. (3).

$$v_4 = -\frac{v_2}{R} \cdot \frac{1}{j\omega C} = -\frac{1}{j\omega CR} \cdot \frac{j\omega CR}{1+j\omega CR} \cdot A \cdot V_{IN} = \quad (3)$$

$$-\frac{A \cdot V_{IN}}{1+j\omega CR}$$

The output $v_3$ from the amplifier 12 and the output $v_4$ from the integrator circuit 13 are fed to an adding circuit 14, which produces the sum of these two input signals. Therefore, the output $V_{OUT}$ from the adding circuit 14 is given by Eq. (4).

$$V_{OUT} = -R \left( \frac{-v_3}{R} - \frac{v_4}{R} \right) = A \cdot \frac{j\omega CR}{1+j\omega CR} \cdot \quad (4)$$

$$V_{IN} + \frac{A \cdot V_{IN}}{1+j\omega CR} = A \cdot V_{IN}$$

It follows that the output from the adding circuit 14 is the input signal $V_{IN}$ multiplied by A. That is, the input signal $V_{IN}$ is reproduced at the output of the adding circuit 14, as shown at D of FIG. 2. It is to be understood that setting the time constant of the differentiator circuit 10 equal to the time constant of the integrator circuit 13 is essential to the novel rectangular filter.

After a given time passes since the input signal $V_{IN}$ has been applied, the capacitor of the integrator circuit 13 is shorted out by a switch. In this way, a rectangular wave as shown at E of FIG. 2 can be obtained. That is, the input step wave is transformed into a rectangular wave. For this reason, the filter is known as a rectangular filter.

Figure 3:
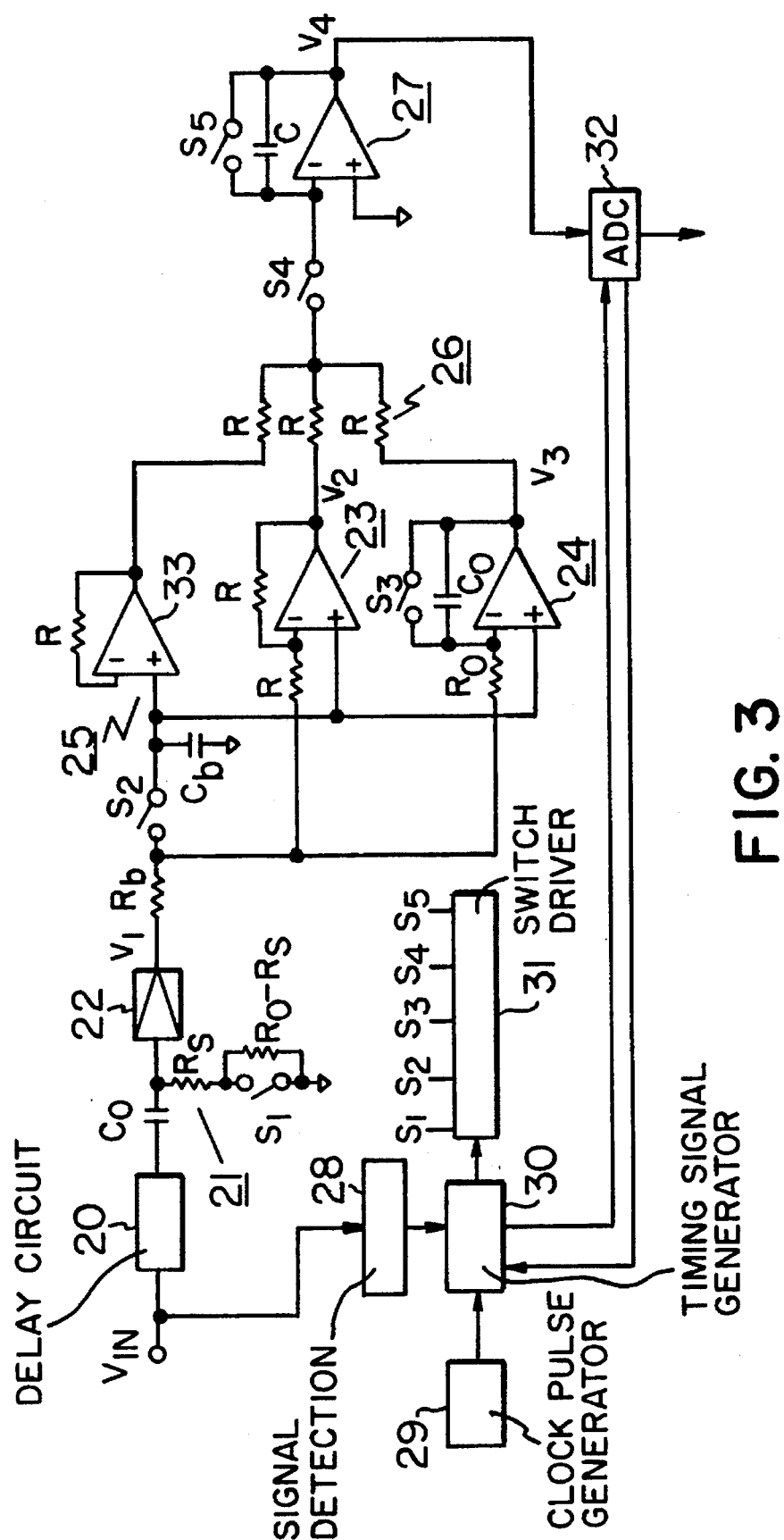
FIG. 3 is a circuit diagram of a filter amplifier using another rectangular filter according to the invention and a gated integrator.
Figure 4:
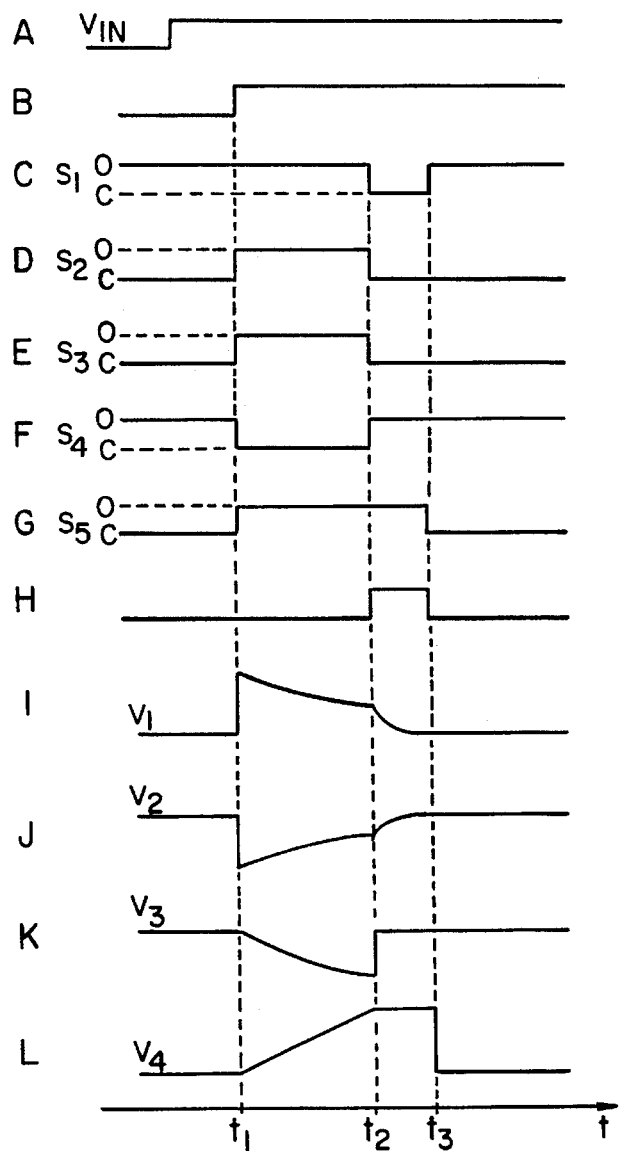
FIG. 4 is a timing chart illustrating the waveforms appearing at various locations in the circuit shown in FIG. 3 and the timing at which switches $S_1$–$S_5$ are operated.
Figure 5:
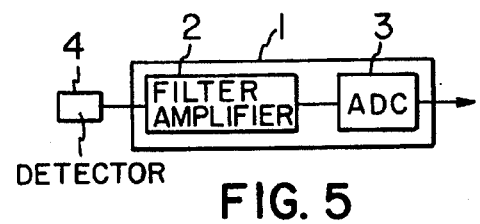
FIG. 5 is a schematic circuit diagram of a prior art pulse processor.

FIG. 3 shows a filter amplifier using another rectangular filter according to the invention and a gated integrator. FIG. 4 shows the waveforms at various portions of the configuration shown in FIG. 3, as well as the timing at which switches $S_1$–$S_5$ are operated. The circuit shown in FIG. 3 treats current signals.

The filter amplifier shown in FIG. 3 comprises a delay circuit 20, a differentiator circuit 21, an amplifier 22, an inverting amplifier 23, an integrator circuit 24, a baseline reproduction circuit 25, an adding circuit 26, a gated integrator 27, a signal detection circuit 28, a reference clock pulse generator 29, a timing signal-generating circuit 30, a switch driver 31 and an analog-to-digital converter 32.

A step wave from a detector (not shown in FIG. 3) is applied to the delay circuit 20 and also to the signal detection circuit 28. When the detection circuit 28 detects the step wave, the circuit produces a signal to the timing signal-generating circuit 30, the signal indicating the application of the step wave. This signal detection circuit 28 compares the level at its input terminals for example, with a preset threshold value. If a signal having a level exceeding the threshold value is applied, the detection circuit 28 produces a pulse.

If the signal indicating the application of the step wave is received from the signal detection circuit 28, the timing signal-generating circuit 30 creates signals for operating switches $S_1$–$S_5$ according to clock pulses from the reference clock pulse generator 29. The created signals are supplied to the switch driver 31. The timing signal-generating circuit 30 creates a signal indicating the timing at which the converter 32 makes analog-to-digital conversion, and supplies this signal to the A/D converter 32. The switch driver 31 supplies signals for driving the switches $S_1$–$S_5$ to these switches $S_1$–$S_5$, respectively.

When one analog-to-digital conversion ends, the A/D converter 32 produces a signal indicating that the conversion ends to the timing signal-generating circuit 30. On receiving this signal, the timing signal-generating circuit 30 terminates its processing.

The input signal $V_{IN}$ is delayed by a given time by means of the delay circuit 20. This delay circuit 20 is provided to absorb the time required by the timing signal-generating circuit 30 to create the signals for driving the switches $S_1$–$S_5$ and for creating the signal indicating the timing at which the analog-to-digital conversion is made. As a result, the following signal processing steps as described later can be effected synchronously.

The output from the delay circuit 20 is differentiated by the differentiator circuit 21 equipped with the switch $S_1$. As shown at C of FIG. 4, this switch $S_1$ is normally open. When a given time passes since the step wave has been applied, the switch $S_1$ is closed. The switch is again opened after a lapse of a given time. At C-G of FIG. 4, "O" indicates that the switch is open. "C" indicates that the switch is closed.

Therefore, the time constant is $C_O R_O$ when the signal is differentiated. This time constant is the time constant of this rectangular filter. However, when the switch $S_1$ is closed, electric charge stored in the capacitor is released. At this time, the time constant is $C_O R_S$, which is set shorter than the time constant $C_O R_O$ obtained when the signal is differentiated.

The differentiator circuit 21 is provided with the switch $S_1$ for the following reason. Generally, a differentiator circuit has a long tail. That is, a long time passes until the differentiator circuit output returns to zero level. The time taken to process signals is prolonged accordingly. This is an undesirable phenomenon because the counting rate characteristics are deteriorated.

Accordingly, the differentiator circuit 21 of this rectangular filter is equipped with the switch $S_1$ for electrically discharging the capacitor. This switch $S_1$ is closed when a given time passes since the input signal has been differentiated. This quickly releases the electric charge stored in the capacitor. In this way, the time required for the processing is shortened. In consequence, the output from the differentiator circuit 21 can be made to assume a substantially rectangular waveform. Also, the counting rate characteristics can be improved.

The output from the differentiator circuit 21 is amplified by the amplifier 22. Accordingly, if a signal as shown at A of FIG. 4 is applied, the output from the delay circuit 20 assumes the form shown at B of FIG. 4. The switch S1 is activated at the timing shown at C of FIG. 4. As a result, the output $v_1$ from the amplifier 22 takes the form shown at I of FIG. 4.

The amplifier $v_1$ from the amplifier 22 is fed via a resistor $R_O$ to the inverting amplifier 23, the integrator circuit 24, and the baseline reproduction circuit 25. The inverting amplifier 23 is an amplifier having a gain of −1. Therefore, the output $v_2$ from this amplifier 23 assumes the form shown at J of FIG. 4.

The time constant of the integrator circuit 24 is $C_O R_O$ which is equal to the time constant of the differentiator circuit 21 when it is performing its differentiating operation. The differentiator circuit 21 carries out this operation from instant $t_1$ to instant $t_2$ shown in FIG. 4. Therefore, it is necessary for the integrator circuit 24 to perform the integration operation only during this period. For this purpose, the switch $S_3$ is provided. This switch $S_3$ is closed when the integration operation ends at instant $t_2$ shown in FIG. 4. As a result, the electric charge stored in the capacitor is released. The output $v_3$ from the integrator circuit 24 takes the form shown at K of FIG. 4.

As can be seen from the description made thus far, in this rectangular filter, the time constant of the differentiator circuit 21 and the time constant of the integrator circuit 24 vary during processing of signals. Therefore, it can be said that this rectangular filter is a so-called time variant filter.

The output $v_2$ from the inverting amplifier 23 and the output $v_3$ from the integrator circuit 24 are summed up by the adding circuit 26. If these two outputs $v_2$ and $v_3$ are simply added up and if the input signal contains an offset component, then the offset component will be added as it is. However, the gated integrator 27 located after the adding circuit 26 is very sensitive to the offset component. Therefore, if the offset component is added to the output from the adding circuit 26, then the offset component will also be integrated. This makes it impossible to precisely detect the height of the input step wave.

The baseline reproduction circuit 25 is provided to remove the offset component from the input signal. The reproduction circuit 25 is composed of a memory capacitor $C_b$ and an operational amplifier having a gain of unity. The capacitor $C_b$ holds the offset component contained in the output $v_1$ from the amplifier 22. The time constant of the baseline reproduction circuit 25 is $C_b R_b$.

Consequently, the level held by the memory capacitor $C_b$ is directly delivered from the baseline reproduction circuit 25 and supplied to the adding circuit 26. The output $v_3$ from the inverting amplifier 23 and the output $v_3$ from the integrator circuit 24 assume a meaningful state during the period from $t_1$ to $t_2$ shown in FIG. 4. The baseline reproduction circuit 25 produces the level of the offset component to the adding circuit 26 only during this period. The switch $S_2$ is provided for this purpose and opened only during the period from $t_1$ to $t_2$ as shown at D of FIG. 4.

In this way, the output from the adding circuit 26 is the sum of the output from the inverting amplifier 23, the output from the integrator circuit 24 and the output from the baseline reproduction circuit 25 and so the output from the adding circuit 26 does not contain the offset component. Obviously, the output current from the adding circuit 26 takes a rectangular waveform.

The output from the adding circuit 26 is supplied to the gated integrator 27 via the switch $S_4$. Since it is only necessary for the gated integrator 27 to integrate its input signal while the output signal from the adding circuit 26 is in the meaningful state, i.e., from $t_1$ to $t_2$ in FIG. 4. This switch $S_4$ is closed during this period as shown at F of FIG. 4.

In the gated integrator 27, the switch $S_5$ is connected in parallel with the integrating capacitor. This switch $S_5$ is opened for a time longer than the period in which the output from the adding circuit 26 is in the meaningful state as shown at G of FIG. 4. That is, the switch $S_5$ is opened from $t_1$ to $t_3$ as shown at G of FIG. 4.

Accordingly, the gated integrator 27 integrates its input signal during the period from $t_1$ to $t_2$ as shown at L of FIG. 4. Since the integrated input signal is the rectangular wave delivered from the adding circuit 26, the integrated output from the integrator 27 changes linearly as shown at L of FIG. 4.

After the end of the integration, the integrated value is held in the capacitor during the period from $t_2$ to $t_3$ as shown in FIG. 4. Finally, the output $v_4$ from the gated integrator 27 assumes the form as shown at L of FIG. 4.

The output $v_4$ from the gated integrator 27 is supplied to the analog-to-digital converter 32, so that the analog output $v_4$ is converted into digital form. The output signal from the timing signal-generating circuit 30 indicates the instant at which the analog-to-digital conversion is made. This signal is supplied to the A/D converter 32 at the instant $t_2$ shown in FIG. 4. In consequence, the converter 32 performs the analog-to-digital conversion during the period from $t_2$ to $t_3$ shown in FIG. 4.

Where an analog signal is converted into digital form, a peak-holding circuit for holding the signal is normally necessitated. In this filter amplifier, the gated integrator 27 holds the integrated value for a given time. Therefore, it is only necessary for the A/D converter 32 to convert the analog output from the gated integrator 27 into digital form as it is. This dispenses with the peak-holding circuit. In consequence, the circuit configuration is made simpler. Furthermore, the number of the components of the circuit can be reduced. Hence, the cost can be curtailed.

As can be understood from the description made thus far, desired resolution can be obtained from this filter amplifier by setting the time constant of the differentiator circuit 21 to a desired value. Furthermore, the input step wave can be converted into an almost ideal rectangular wave. Consequently, the counting rate characteristics can be enhanced.

Moreover, the novel filter amplifier is much simpler in configuration than the prior art design. This makes it possible to reduce the production cost. In addition, it is very easy to control the production process when the filter amplifier is being built.

Figure 6:
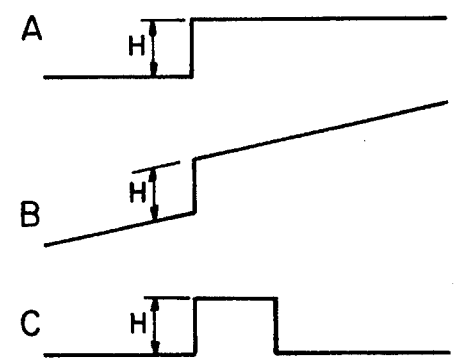
FIG. 6 is a diagram illustrating step waves produced from a detector and rectangular waves produced by a rectangular filter.
Figure 7:
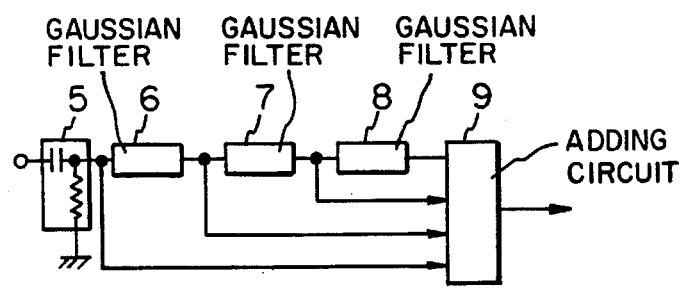
FIG. 7 is a circuit diagram of the prior art rectangular filter.

In the description made thus far, it is assumed that an ideal step wave is applied. Even if a step wave as shown at B of FIG. 6 is applied, the output from the adding circuit 26 is a good rectangular wave. We have confirmed that the height of the step wave can be precisely detected by the gated integrator 27. Also, we have confirmed that the figure of merit of the filter amplifier shown in FIG. 3 is superior to the figure of merit of any kind of conventional filter amplifier.

While the preferred embodiments of the present invention have been described, it is to be understood that the invention is not limited to such embodiments. Rather, various modifications and changes are possible within the scope of the invention delineated by the following claims.

For example, in one of the above embodiments, the baseline reproduction circuit 25 comprises the memory capacitor and the operational amplifier having a gain of unity. The structure already proposed by the present applicant in Japanese Patent Application Serial No. 18841/1992 may also be used. Also in the above embodiment, the baseline reproduction circuit 25 is connected in parallel with the integrator circuit 24. The reproduction circuit 25 may also be connected before the integrator circuit 24.

Having thus described our invention with the detail and particularity required by the Patent Laws, what is claimed protected by Letters Patent is set forth in the following claims.

What is claimed is:

1. A pulse shaping circuit for a step input signal comprising:
    a differentiator circuit having an input and an output, said differentiator circuit connected for differentiating said step input signal, said differentiator circuit having a time constant;
    an integrator circuit having an input and an output, and a time constant equal to the time constant of said differentiator circuit, said integrator circuit connected to integrate an output signal from said differentiator circuit; and
    an adding circuit having inputs and an output, said adding circuit coupled to said differentiator circuit and said integrator circuit for adding the output signal from said differentiator circuit and the output signal from said integrator circuit to provide an amplified step output.

2. The pulse shaping circuit of claim 1, wherein said differentiator circuit comprising a first switch for switching the time constant of said differentiator circuit between different values.

3. The pulse shaping circuit of claim 1 or 2, wherein said integrator circuit comprising a second switch for releasing electric charge stored in an integrating capacitor.

4. The pulse shaping circuit of claim 1 or 2, further comprising a baseline reproduction circuit for removing an offset component from the input signal connected in parallel with said integrator circuit.

5. The pulse shaping circuit of claim 3, further comprising a baseline reproduction circuit for removing an offset component from the input signal connected in parallel with said integrator circuit.

6. The pulse shaping circuit of claim 1 or 2, further comprising a baseline reproduction circuit for removing an offset component from the input signal placed before said integrator circuit.

7. The pulse shaping circuit of claim 3, further comprising a baseline reproduction circuit for removing an offset component from the input signal placed before said integrator circuit.

8. A filter amplifier comprising:
    a pulse shaping circuit for a step input signal having a differentiator circuit having an input and an output, said differentiator circuit connected for differentiating said step input signal, said differentiator circuit having a time constant, an integrator circuit having an input and an output and a time constant equal to the time constant of said differentiator circuit, said integrator circuit connected to integrate an output signal from said differentiator circuit, and an adding circuit having inputs and an output, said adding circuit coupled to said differentiator circuit and said integrator circuit for adding the output signal from said differentiator circuit and the output signal from said integrator circuit; and
    a gated integrator for integrating an output signal from said adding circuit for a predetermined time generating a shaped pulse at an output of said filter amplifier.

* * * * *

UNITED STATES PATENT AND TRADEMARK OFFICE
CERTIFICATE OF CORRECTION

PATENT NO. : 5,576,658
DATED : November 19, 1996
INVENTOR(S) : Kazuo Hushimi and Masahiko Kuwata It is certified that error appears in the above-indentified patent and that said Letters Patent is hereby corrected as shown below:

Column 6 Line 23 "terminals" should read --terminal--.

Claim 2 Line 2 Column 10 "comprising" should read --comprises--.

Claim 3 Line 6 Column 10 "comprising" should read --comprises--.

Signed and Sealed this

First Day of April, 1997

Attest:

BRUCE LEHMAN

Attesting Officer

Commissioner of Patents and Trademarks